(12) United States Patent
Aschieri (10) Patent No.: US 11,683,624 B1
(45) Date of Patent: Jun. 20, 2023

(54) TRANSDUCER WITH ANALOG AND DIGITAL MODULATORS

(71) Applicant: Qualcomm Technologies Inc., San Diego, CA (US)

(72) Inventor: Julian Aschieri, Sharon, MA (US)

(73) Assignee: QUALCOMM Technologies, Inc., San Diego, CA (US)

(*) Notice: Subject to any disclaimer, the term of this patent is extended or adjusted under 35 U.S.C. 154(b) by 0 days.

(21) Appl. No.: 17/318,991

(22) Filed: May 12, 2021

Related U.S. Application Data (60) Provisional application No. 63/023,484, filed on May 12, 2020.

(51) Int. Cl.
| | | |
|---|---|---|
| *H04R 3/00* | (2006.01) | |
| *H04R 1/00* | (2006.01) | |
| *H04R 29/00* | (2006.01) | |
| *H03M 7/00* | (2006.01) | |
| *H03M 3/00* | (2006.01) | |
| *H04R 1/08* | (2006.01) | |

(Continued)

(52) U.S. Cl.
CPC ............ *H04R 1/08* (2013.01); *H01L 41/1132* (2013.01); *H03F 3/183* (2013.01); *H03K 5/24* (2013.01);
(Continued)

(58) Field of Classification Search
CPC ... H04R 1/00; H04R 1/02; H04R 1/04; H04R 1/08; H04R 1/083; H04R 3/00; H04R 3/04; H04R 29/00; H04R 29/004; H04R 17/00; H04R 17/02; H04R 19/00; H04R 19/04; H03F 1/26; H03F 3/181; H03F 3/183; H03F 2200/03; H03K 5/22; H03K 5/24; H01L 41/1132; H03M 3/00; H03M 3/02; H03M 3/04; H03M 3/30; H03M 3/39; H03M 3/412; H03M 3/424; H03M 3/458;
(Continued)

(56) References Cited

U.S. PATENT DOCUMENTS

| | | | |
|---|---|---|---|
| 2,605,361 A | 7/1952 | Cutler | |
| 2,629,857 A | 2/1953 | Deloraine et al. | |

(Continued)

FOREIGN PATENT DOCUMENTS

| | | |
|---|---|---|
| FR | 932140 A | 3/1948 |
| GB | 627462 A | 8/1949 |

OTHER PUBLICATIONS

Kester, W.—ADC Architectures III: Sigma-Delta ADC Basics, 2009, 12 pages.
(Continued)

*Primary Examiner* — Thang V Tran
(74) *Attorney, Agent, or Firm* — Qualcomm Technologies, Inc.

(57) ABSTRACT

A transducer system has 1) a MEMS transducer configured to produce an analog output signal in response to an incident acoustic signal, and 2) a modulator apparatus. The modulator apparatus includes an analog modulator configured to receive the analog output signal and produce a first digital signal as a function of the analog output signal. In addition, the modulator apparatus also has a digital converter configured to receive the first digital signal and produce a second digital signal as a function of the first digital signal. The analog modulator has an analog order while, in a corresponding manner, the digital converter has a digital order. Preferably, the digital order is higher than the analog order.

22 Claims, 7 Drawing Sheets

(51) Int. Cl.
*H03F 3/183* (2006.01)
*H03K 5/24* (2006.01)
*H01L 41/113* (2006.01)
*H03M 7/32* (2006.01)

(52) U.S. Cl.
CPC ............ *H03M 3/39* (2013.01); *H03M 7/3004* (2013.01); *H04R 3/00* (2013.01); *H04R 29/00* (2013.01); *H03F 2200/03* (2013.01); *H04R 2201/003* (2013.01)

(58) Field of Classification Search
CPC ...... H03M 3/464; H03M 3/488; H03M 7/302; H03M 7/3002; H03M 7/3004; H03M 7/3015; H03M 7/3033; H03M 7/3035
See application file for complete search history.

(56) References Cited

U.S. PATENT DOCUMENTS

| | | |
|---|---|---|
| 2,927,962 A | 3/1960 | Cutler |
| 3,192,271 A | 6/1965 | Bonetti et al. |
| 5,404,142 A | 4/1995 | Adams et al. |
| 6,888,484 B2 | 5/2005 | Kiss et al. |
| 2003/0185288 A1* | 10/2003 | Hinrichs ............... H03M 7/302 375/216 |
| 2007/0127761 A1* | 6/2007 | Poulsen ............... H03M 7/3015 381/355 |
| 2009/0278721 A1* | 11/2009 | Hamashita ........... H03M 3/412 341/143 |
| 2016/0090300 A1* | 3/2016 | Tsai ...................... H04R 17/02 257/254 |
| 2019/0123762 A1* | 4/2019 | Bach .................. H03H 17/0416 |
| 2019/0251947 A1* | 8/2019 | Clemow ................ G10K 11/16 |
| 2019/0387326 A1* | 12/2019 | Hansen ............... H03F 3/45183 |

OTHER PUBLICATIONS

Kester, W.—ADC Architectures III: Sigma-Delta ADC Advanced Concepts and Applications, 2009, 11 pages.

* cited by examiner

TRANSDUCER WITH ANALOG AND DIGITAL MODULATORS

RELATED APPLICATIONS

This application claims priority to U.S. Provisional Application No. 63/023,484, filed May 12, 2020 and titled "Transducer with Analog and Digital Modulators" and naming Julian Aschieri as inventor.

The disclosure of the foregoing is incorporated herein by reference, in its entirety.

FIELD OF THE INVENTION

Illustrative embodiments of the generally relate to transducers and, more particularly, various embodiments of the invention relate to improving performance of transducers.

BACKGROUND OF THE INVENTION

A micro-electro-mechanical system (MEMS) acoustic transducer/sensor coverts acoustic energy into electrical signal, and/or converts an electrical signal into acoustic energy. An example of a MEMS acoustic transducer is a MEMS microphone, which converts sound pressure into an electrical voltage. Based on their transduction mechanisms, MEMS microphones can be made in various forms, such as capacitive microphones or piezoelectric microphones.

MEMS capacitive microphones and electret condenser microphones (ECMs) currently dominate the consumer electronics. Piezoelectric MEMS microphones, however, occupy a growing portion of the consumer market, and have unique advantages compared to their capacitive counterparts. Among other things, piezoelectric MEMS microphones do not have a back plate, eliminating the squeeze film damping, which is an intrinsic noise source for capacitive MEMS microphones. In addition, piezoelectric MEMS microphones are reflow-compatible and can be mounted to a printed circuit board (PCB) using typical lead-free solder processing, which could irreparably damage typical ECMs.

Like many other transducers, MEMS microphones typically have associated circuitry to convert their analog output signals to a format that can be processed by downstream electronics. New generation standards requires this circuitry to have a high acoustic overload point and a lower sensitivity—two competing goals that are difficult to simultaneously satisfy.

SUMMARY OF VARIOUS EMBODIMENTS

In accordance with one embodiment of the invention, a transducer system has 1) a MEMS transducer configured to produce an analog output signal in response to an incident acoustic signal, and 2) a modulator. The modulator includes an analog modulator configured to receive the analog output signal and produce a first digital signal as a function of the analog output signal. In addition, the modulator also has a digital converter configured to receive the first digital signal and produce a second digital signal as a function of the first digital signal. The analog modulator has an analog order while, in a corresponding manner, the digital converter has a digital order. Preferably, the digital order is higher than the analog order.

The transducer system may also have an amplifier configured to amplify the analog output signal to produce an amplified analog output signal. In that case, the analog output signal received by the analog modulator is the amplified analog output signal. Moreover, either or both the analog and digital converters each may comprise a sigma-delta converter.

To illustrate ranges of examples, the analog order may be between second-order and fourth-order while the digital order may be between fourth-order and sixth-order. In addition or alternatively, to comply with various standards, the second digital signal may be a one-bit signal. To improve the ultimate output, the system also may have a digital signal operator, which may be one or more of a filter and an equalizer downstream of the analog modulator.

Those skilled in the art may configured the digital converter in a variety of different ways. For example, the digital converter may include a plurality of integrator blocks. Preferably, each integrator block has an associated coefficient, and a plurality of the coefficients are more aggressive when the input signal to its corresponding integrator block rises.

Among other things, the transducer comprises a MEMS microphone. For example, the MEMS transducer may have a piezoelectric diaphragm or piezoelectric cantilever. Alternatively, the transducer may have a capacitive diaphragm to form a condenser. Regardless of the specific transducer technology, the system also may have package with a chamber containing the MEMS transducer and the modulator. The package has an aperture to receive the incident acoustic signal into the chamber.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, an acoustic transducer system provides a more stable output and yet, has a relatively high acoustic overload point and relatively high sensitivity. To that end, the system has a modulator with two portions: a lower-order analog modulator and a downstream higher-order digital modulator. Accordingly, the modulator takes advantage of both the stability of a lower-order analog modulator while obtaining the benefits of a higher-order digital modulator. As such, the modulator may be considered to form a mixed analog and digital modulator. Details of illustrative embodiments are discussed below.

Figure 1:
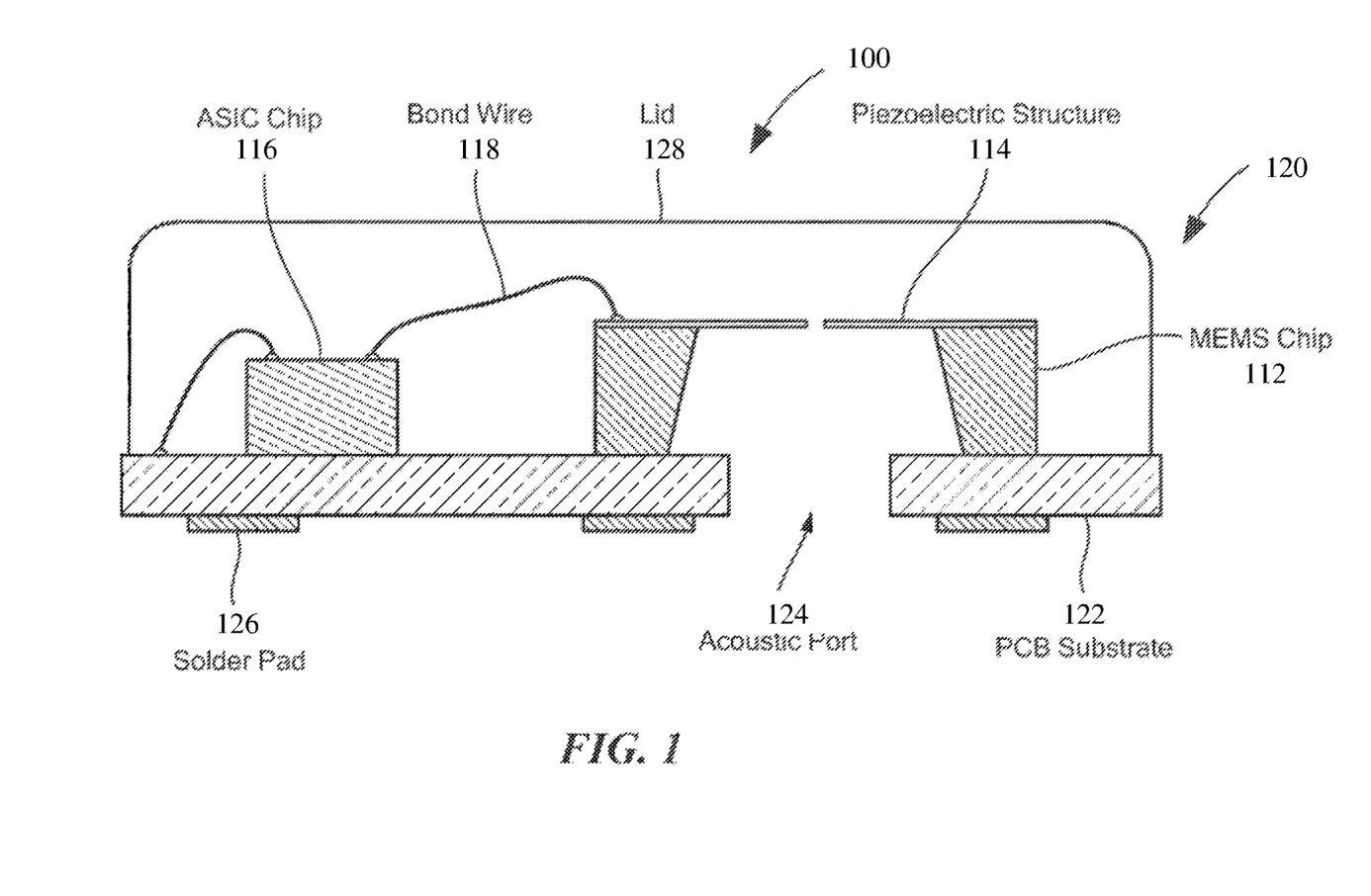
FIG. 1 schematically shows a cross-sectional view of a MEMS acoustic sensor that may implement illustrative embodiments of the invention.

FIG. 1 schematically shows a cross-sectional view of an acoustic sensor implemented as a typical piezoelectric MEMS microphone 100 (also referred to as a "MEMS transducer 100"). As shown, the MEMS microphone 100 of FIG. 1 includes a MEMS chip 112/die having piezoelectric structures 114, e.g. cantilevers or diaphragms, to convert sound pressure into electrical signal, and an application-specific integrated circuit chip/die ("ASIC 116") to buffer and amplify the electrical signal generated by the MEMS chip 112. The MEMS and ASIC chips 112 and 116 are electrically connected by wire bonding 118, and mounted within the interior chamber of a package 120. Specifically, the package 120 has a substrate 122 (e.g., a printed circuit board) that forms an acoustic port 124 for enabling sound pressure to access the MEMS chip 112, and multiple solder pads 126 for users to solder the microphone package 120 onto their boards. A metal lid 128 is typically used to form the housing of the microphone and to mitigate electromagnetic interference (EMI).

As noted, the MEMS chip 112 may be formed from one or more piezoelectric cantilevers or diaphragms (discussed below). Cantilever based piezoelectric structure 114 is preferable in many cases as it typically is stress free after the die is released during fabrication. On the other hand, the diaphragm structure of such a microphone chip 112 typically requires more stress control in the fabrication process as minimal residual stress within the diaphragm can result in significant sensitivity degradation. Multiple cantilevers can be arranged to form a piezoelectric sensing structure, e.g., a square shape, a hexagon shape, an octagon shape, or some other shape.

Rather than implement the system with two separate chips, some embodiments may implement both the MEMS chip 112 and ASIC 116 of this and other embodiments as part of the same die. Accordingly, discussion of separate chips is for illustrative purposes.

Figure 2:
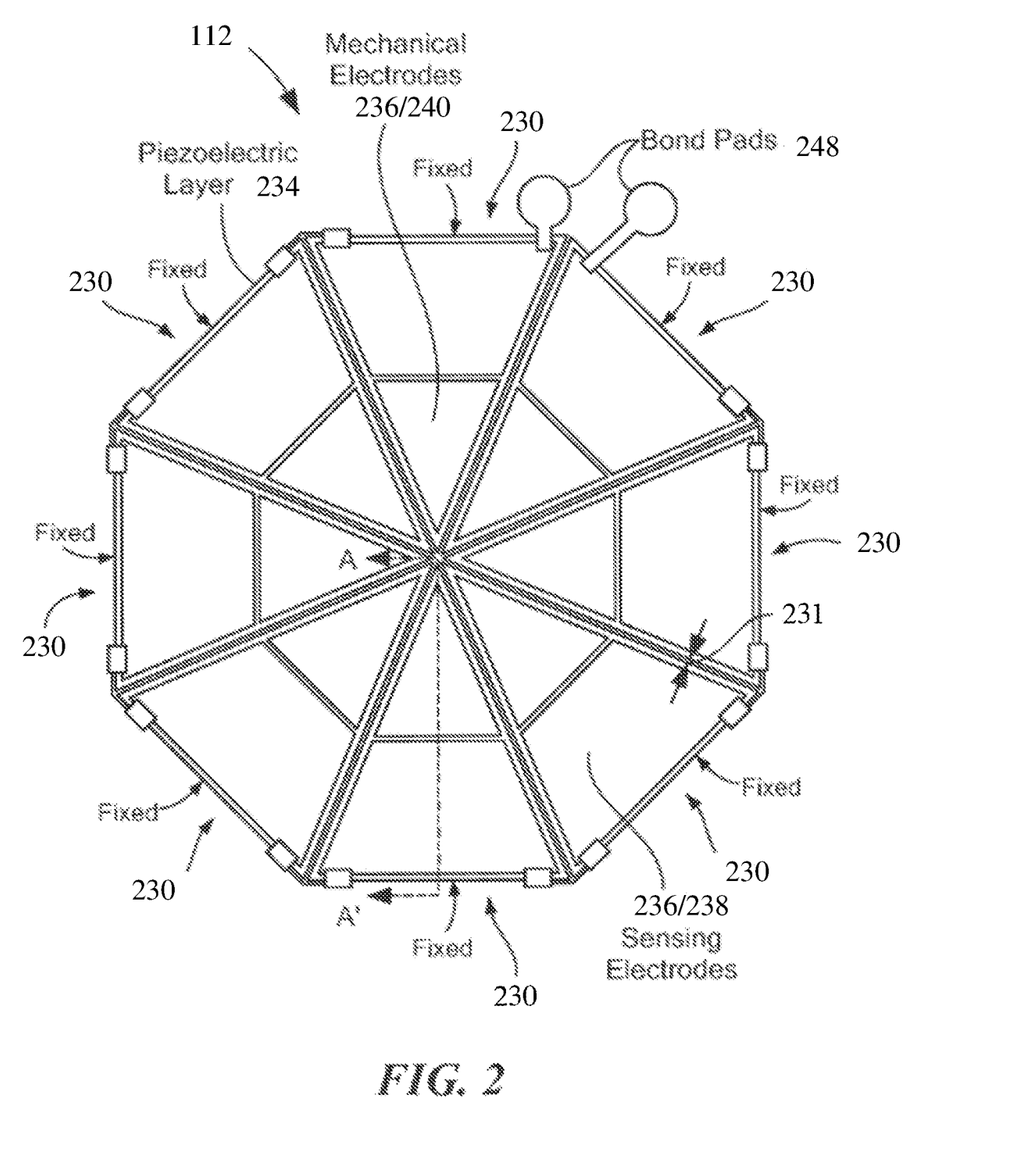
FIG. 2 schematically shows a plan view of a generic piezoelectric MEMS acoustic sensor die.
Figure 3:
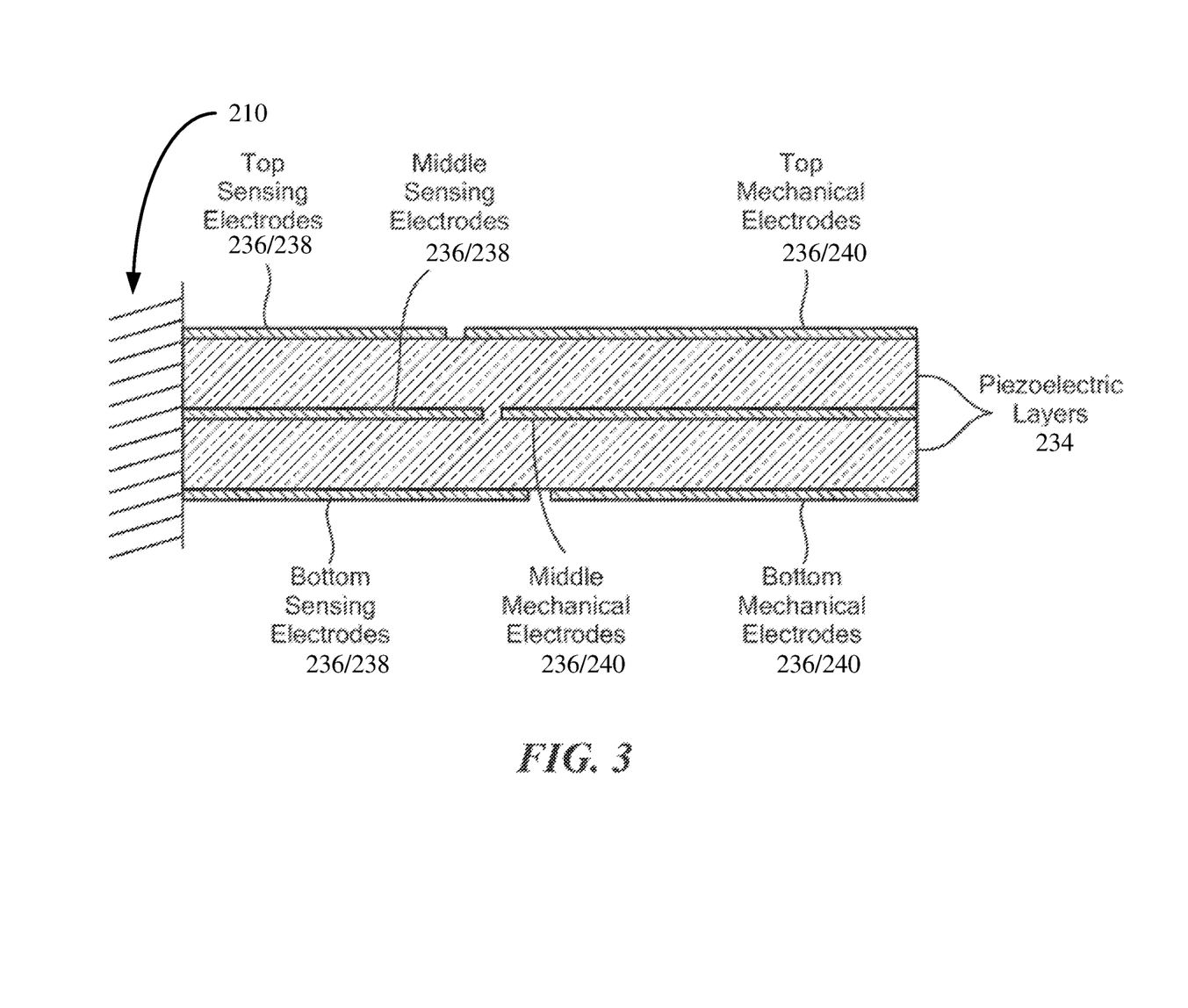
FIG. 3 schematically shows a cross-sectional view of a cantilever member of the MEMS acoustic sensor die across line A-A' of FIG. 2.

FIG. 2 schematically shows a plan view of an exemplary microphone chip 112 using eight sense members (also known as "sense arms") formed as piezoelectric triangular cantilevers 230. These members together form an octagonal MEMS acoustic sensor. FIG. 3 shows a cross-sectional view of one of those cantilevers 230. Indeed, some embodiments may use more or fewer cantilevers 230. Accordingly, as with other features, discussion of eight cantilevers 230 is for illustrative purposes only. These triangular cantilevers 230 are fixed to a substrate 210 (e.g., a silicon substrate) at their respective bases and are configured to freely move in response to incoming/incident sound pressure (i.e., an acoustic wave). Triangular cantilevers 230 are preferable to rectangular ones as they form a gap controlling geometry. Specifically, when the cantilevers 230 bend up or down due to either sound pressure or residual stress, the gaps between adjacent cantilevers 230 typically remain relatively small.

The cantilever 230 can be fabricated by one or multiple layers of piezoelectric material sandwiched by top and bottom metal electrodes 236. FIG. 3 schematically shows an example of this structure. The piezoelectric layers 234 can be made by typical piezoelectric materials used in MEMS devices, such as one or more of aluminum nitride (AlN), aluminum scandium nitride (AlScN), zinc oxide (ZnO), and lead zirconate titanate (PZT). The electrodes 236 can be made by typical metal materials used in MEMS devices, such as one or more of molybdenum (Mo), platinum (Pi), nickel (Ni) and aluminum (Al). Alternatively, the electrodes 236 can be formed from a non-metal, such as doped polysilicon. These electrodes 236 can cover only a portion of the cantilever 30, e.g., from the base to about one third of the cantilever 230, as these areas generate electrical energy more efficiently within the piezoelectric layer 234 than the areas near the free end. Specifically, high stress concentration in these areas near the base induced by the incoming sound pressure is converted into electrical signal by direct piezoelectric effect.

The electrodes 236 are generally identified by reference number 236. However, the electrodes used to sense signal are referred to as "sensing electrodes" and are identified by reference number 238. These electrodes are preferably electrically connected in series to achieve the desired capacitance and sensitivity values. In addition to the sensing electrodes 238, the rest of the cantilever 230 also may be covered by metal to maintain certain mechanical strength of the structure. However, these "mechanical electrodes 240" do not contribute to the electrical signal of the microphone output.

Although the figures and this description discuss the piezoelectric MEMS acoustic sensor in great detail, those skilled in the art can apply various embodiments to other types of transducers. For example, various embodiments may apply to general inertial sensors, such as accelerometers and gyroscopes, pressure sensors, tilt sensors, speakers, chemical sensors, and/or ultrasonic transducers, condenser/capacitive microphones, and other types of sensors. Accordingly, detailed discussion of a piezoelectric MEMS acoustic sensor is primarily for illustrative purposes and not intended to limit various other embodiments of the invention.

Figure 4A:
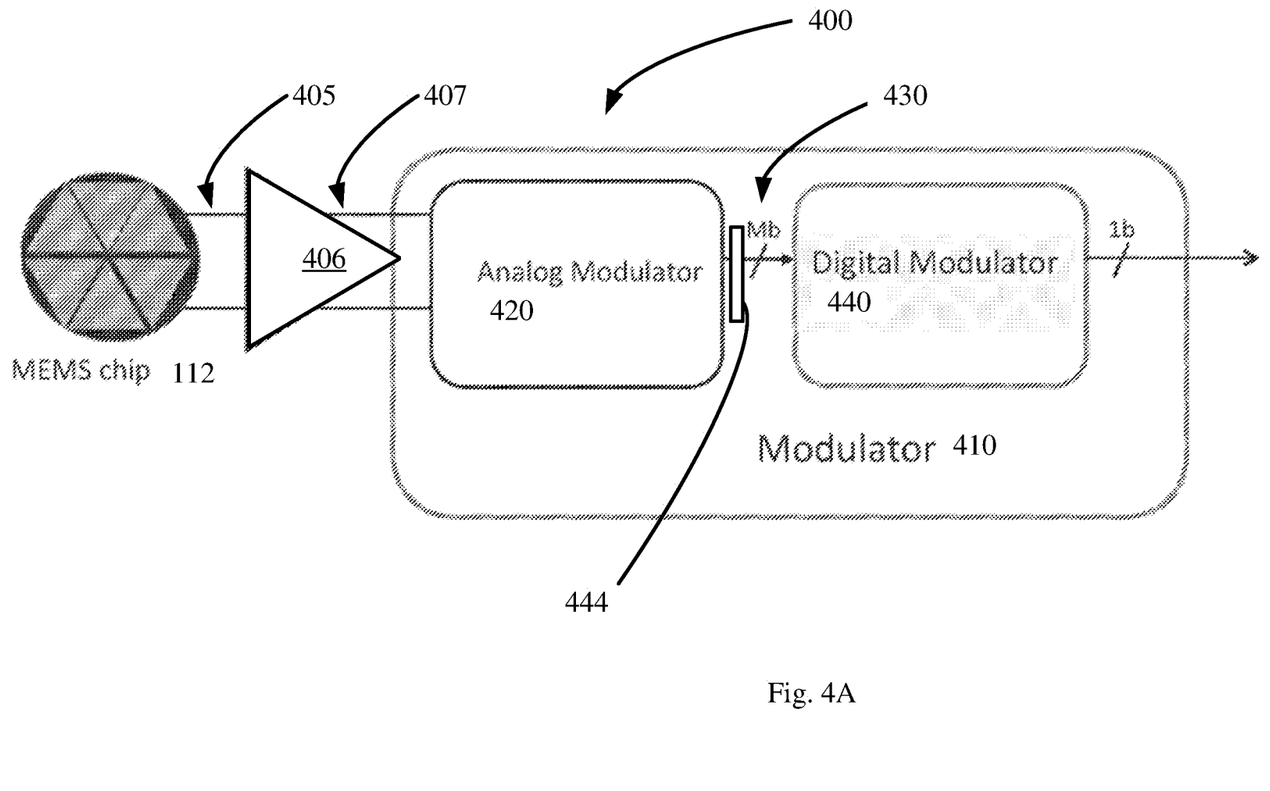
FIG. 4A schematically shows the pipeline of a signal through the MEMS acoustic sensor in illustrative embodiments of the invention.

FIG. 4A schematically shows a high-level view of a signal pipeline 400 between the transducer/microphone and the output of the overall microphone system 100 in accordance with illustrative embodiments. As shown, the MEMS chip 112 produces an analog output signal in response to an incoming acoustic signal. Ultimately, that analog output signal passes through the pipeline 400 of electronic elements, which includes a modulator 410, to produce a digital output signal for further processing by downstream electronics (e.g., off chip circuitry). As such, various embodiments relate primarily to a "digital microphone."

The analog signal produced by the MEMS chip 112 preferably is amplified by an amplifier 406 before the modulator 410 converts the signal into a specified 1-bit digital signal at the output. For example, in the embodiment of FIG. 4A, the MEMS output is coupled to amplifier 406 at node 405, and the output of amplifier 406 is coupled to the modulator 410 at node 407.

Prior art designs known to the inventors typically implemented the modulator as a fourth-order analog modulator (e.g., a pulse density modulator). Although relatively stable, these prior art modulators have limitations. Among others, such modulators require a lower sensitivity to achieve a high acoustic overload point ("AOP"). Higher-order analog modulators are not a solution, however, because they generally are less stable, less flexible, and do not scale well.

Rather than using a higher-order analog modulator or a higher-order digital modulator alone, the inventors recognized that they could break up the modulator function into at least two distinct portions:

1. An analog modulator/converter (referred to as "analog modulator 420") at a stable, lower-order, and
2. A digital modulator/converter (referred to as "digital modulator 440") at a stable, higher-order.

Various embodiments of this solution provide the benefits of both the analog and digital domains without many of the problems of using either one alone. Specifically, the analog modulator 420 converts the input acoustic signal into a digital signal having "m" bits, while the digital modulator 440 converts the m-bit signal into the noted single-bit output signal.

Figure 4B:
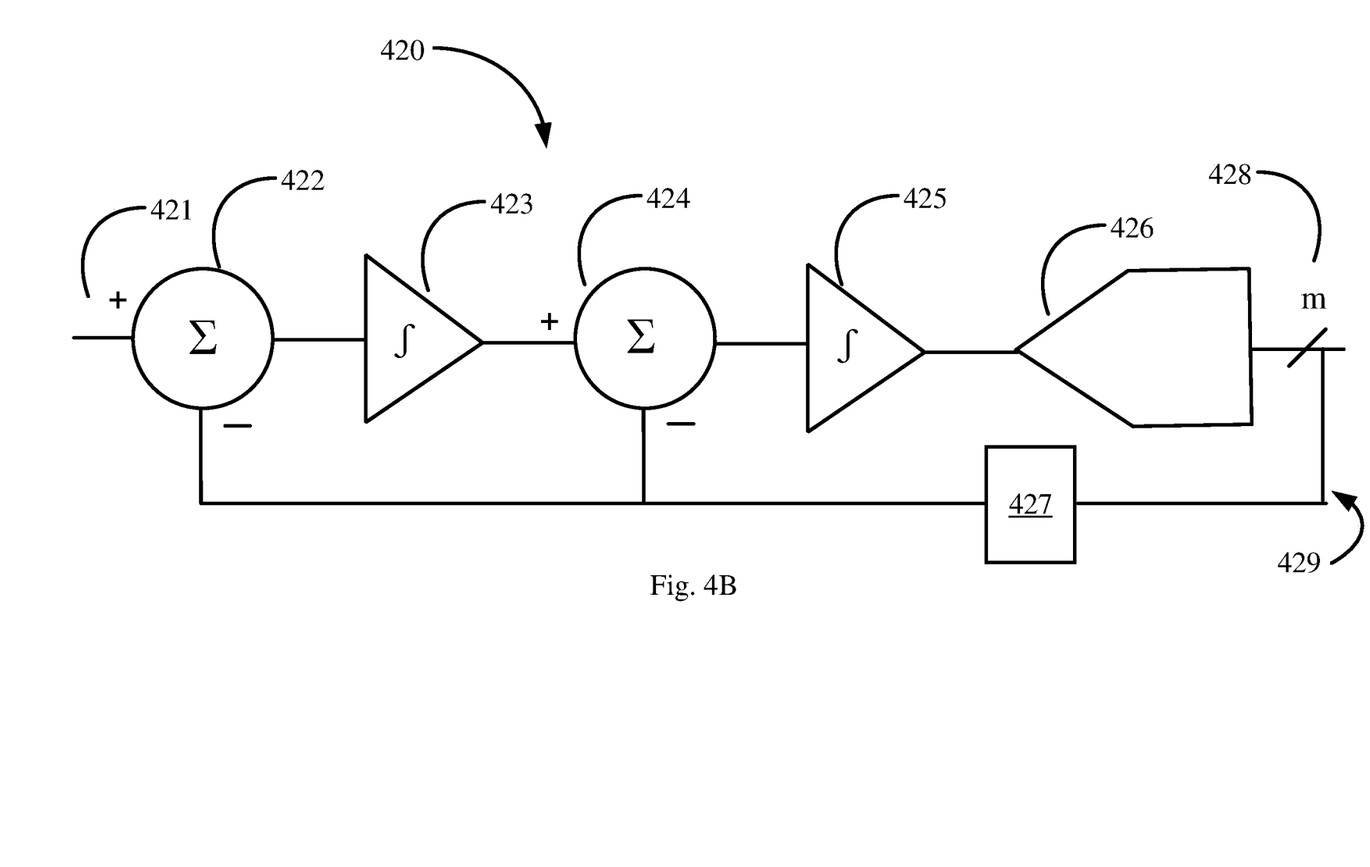
FIG. 4B schematically shows an embodiment of an analog modulator with digital output.

FIG. 4B schematically shows an embodiment of an analog modulator 420 with analog input and digital output. As illustrated in FIG. 4B, the analog modulator 420 has an input terminal 421 in electrical communication with a transducer (e.g., in some embodiments via an amplifier 406) and configured to receive an analog transducer output signal from the transducer. The analog modulator 420 includes several analog integrator circuits (423, 425) and several corresponding summing junctions (422, 423). The input terminal 421 is coupled in electrical communication with a first summing junction 422. The summing junction is coupled in electrical communication with a first integrator circuit 423 and provides a first summed output to the first integrator circuit 423. The first integrator 423 circuit integrates the first summed output received from the first summing junction 422 to produce a first integrated signal, and provides the first integrated signal to the second summing junction 424. The second summing junction 424 is coupled in electrical communication with the second integrator circuit 425, and provides a second summed output to the second integrator circuit 425. The second integrator circuit 425 produces a second integrated signal. The second integrator circuit 425 is coupled in electrical communication to a multibit analog-do-digital converter 426 and provides the second integrated signal to the multibit analog-do-digital converter 426. The multibit analog-do-digital converter 426 converts the second integrated signal into a multibit digital signal, the multibit digital signal having a set of bits (where the number of bits in the set of bits is expressed as "m"). The set of m bits includes more than one bit. The multibit analog-to-digital converter 426 is coupled in electrical communication with the output terminal 428 of the analog modulator 420. In the system 400, the output terminal 428 of the analog modulator is coupled in electrical communication with the digital modulator 440. The analog modulator 420 also includes a feedback path 429 coupled to the multibit analog-to-digital converter 426 to receive the multibit digital signal. The feedback path 429 includes a digital-to-analog converter 427 configured to convert the multibit digital signal to an analog feedback signal. The digital-to-analog converter 427 is in electrical communication with each of the summing junctions (422, 424) to provide the analog feedback signal to each of the summing junctions. Consequently, the first summed output of the first summing junction 422 is the sum of the signal received at input terminal 421 and the inverse of the analog feedback signal, and the second summed output of the second summing junction 424 is the sum of the first integrated signal and the inverse of the analog feedback signal. In other words, the first summed output is the difference between the signal received at input terminal 421 and the analog feedback signal, and the second summed output of the second summing junction 424 is the difference between the first integrated signal and the analog feedback signal.

The embodiment of the analog modulator 420 of FIG. 4B is a second-order analog sigma-delta modulator. Other embodiments may have more or fewer integrators, and so may be higher order (i.e., more than second-order) or lower order (i.e., first order), respectively. For example, an analog modulator having three integrators (and three corresponding summing junctions each configured to receive the analog feedback signal) may be referred-to as a third-order analog modulator, and an analog modulator having four integrators (and four corresponding summing junctions each configured to receive the analog feedback signal) may be referred-to as a fourth-order analog modulator, and so forth. In illustrative embodiments, the order of the analog modulator 420 is preferably lower than the order of the digital modulator 440.

The output of the analog modulator 420 is coupled to the input of the digital modulator 440 at node 430, so that the digital signal produced by the analog modulator is provided as in input signal to the digital modulator 440.

Preferably, both the analog and digital modulators 420 and 440 are implemented as sigma-delta modulators, although they could be implemented as other similar technologies that accomplish the same result. For example, the analog modulator 420 can be implemented as a second-order sigma-delta modulator having a high AOP and still handle signals, in some embodiments, as high as the supply voltage, Vdd. The power consumption in this lower-order modulator 420 is modest when compared to power consumption in many fourth-order analog modulators. Moreover, in various embodiments, the signal-to-quantization-noise ratio may be high with minimal performance impact.

The digital modulator 440 can be implemented as a higher-order sigma-delta modulator, such as a sixth-order sigma-delta modulator, that down-converts the m-bit signal to the noted one-bit output signal. Despite being a relatively high-order device, because it operates in the digital domain, the digital modulator 440 has a predictable output with a lower power requirement than comparable analog designs. It also has the ability to be more easily be changed out in other designs requiring a higher-order modulator.

Accordingly, illustrative embodiments achieve the benefits of a higher-order modulator via the digital modulator 440 while maintaining stability and the more basic functional requirements using the analog modulator 420. The stability of the digital modulator 440 at substantially higher-orders enables more flexibility and range for the overall microphone 10.

As noted, the order of the digital modulator 440 preferably is higher than the order of the analog modulator 420. For example, the analog modulator 420 may range from a first-order modulator to a fourth, fifth, or higher-order modulator. In a corresponding manner, the digital modulator 440 may range from a second-order modulator to a third, fourth, fifth, sixth, seventh, eighth, or higher-order modulator. Indeed, preferred embodiments ensure that the order of the digital modulator 440 is greater than that of the analog modulator 420. Accordingly, even if the analog modulator 420 were a higher-order (fourth-order), then preferred embodiments would use a fifth-order or higher-order digital modulator 440. One skilled in the art can determine an appropriate order for each of the modulators 420 and 440 as a function of the desired performance and application.

The microphone 100 preferably implements this functionality on the ASIC chip 116. In addition, the pipeline 400, whether or not implemented on the ASIC chip 116, can have additional functional blocks, such as a low pass filter, equalization, etc., in the digital domain (e.g., downstream of the of the digital modulator 440). For example, to improve the ultimate output, some embodiments include a digital signal operator 444, which may be one or more of a filter and an equalizer downstream of the analog modulator 420.

Figure 5A:
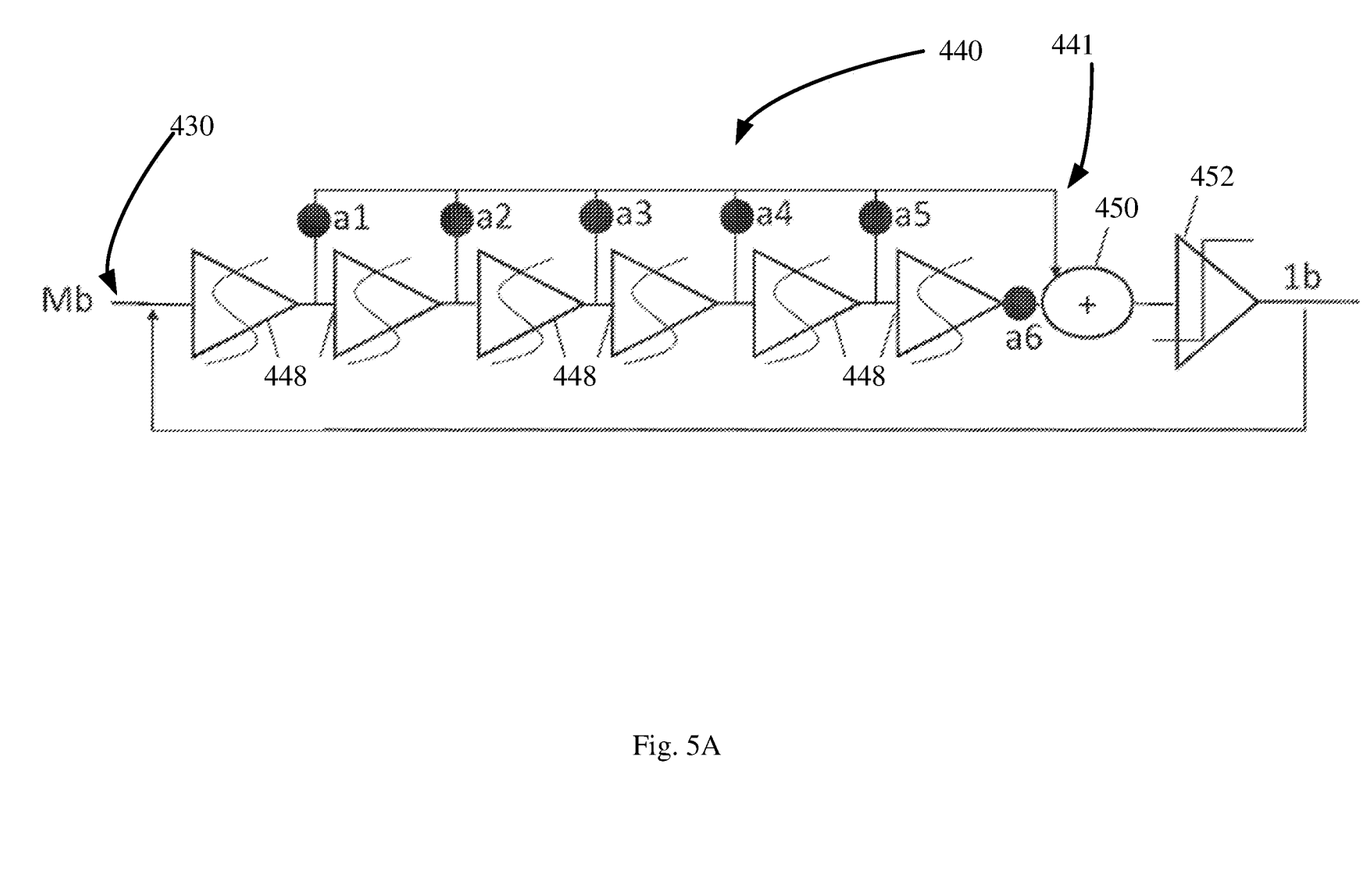
FIG. 5A schematically shows a digital modulator configured in accordance with illustrative embodiments of the invention.

FIG. 5A schematically shows one implementation of the digital modulator 440 in accordance with illustrative embodiments. As shown, the input of the digital modulator 440 receives the m-bit digital signal from analog modulator 420, and converts it into the noted 1-bit output signal at the output of the overall modulator 410. In illustrative embodiments, the digital modulator 440 has a plurality of components that together form a loop. Those components include a serially arranged plurality of integrators 448 preferably implemented as digital integrators (also identified by reference number "448"). The inputs of the middle digital integrators 448 each couple with the output of the immediately prior digital integrator 448. In addition, the first digital integrator 448 in the series receives the m-bit input signal, while the last digital integrator 448 couples with a summing node 450 (e.g., an adder).

The output of each digital integrator 448 couples with an indirect transmission path 441 that couples weighted output signals from the outputs of each of the different digital integrators 448 to the summing node 450. The weighting factors are shown in the figures as a1-a6.

To maintain stability up to high input levels, the coefficients preferably are updated to less aggressive values when the signal increases. Conversely, the coefficients may be updated to more aggressive values when the signal decreases. As such, the input signal may be monitored with different thresholds and hysteresis, and new values may be set as appropriate.

Figure 5B:
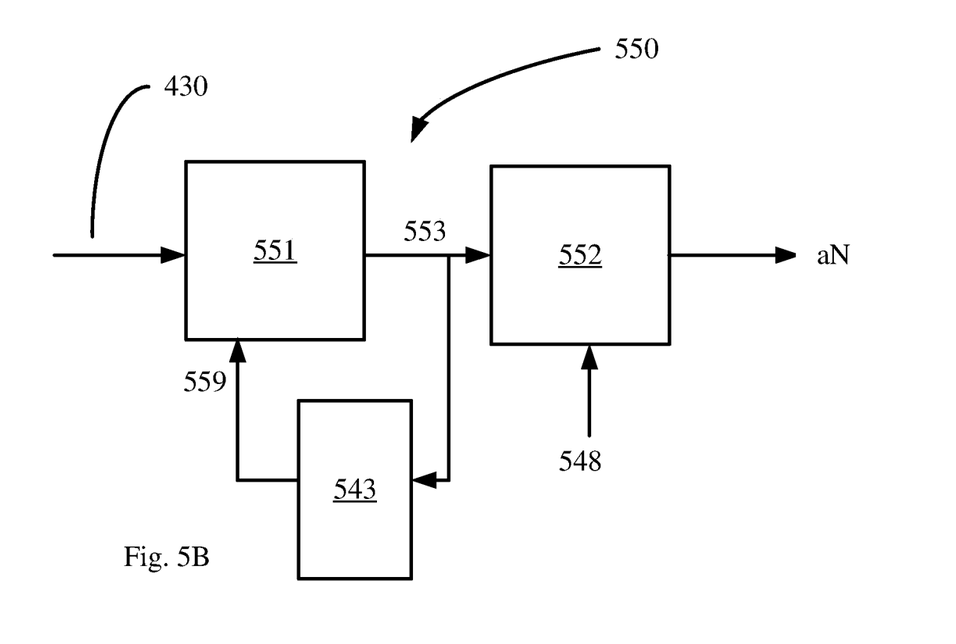
FIG. 5B schematically illustrates an embodiment of a signal level monitor and coefficient updating circuit.
Figure 5C:
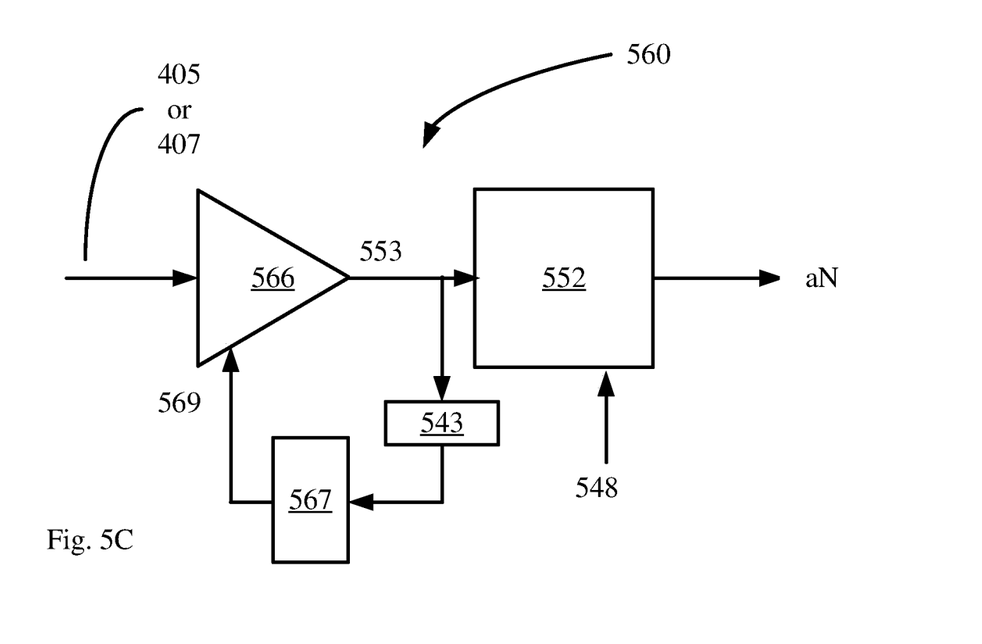
FIG. 5C schematically illustrates another embodiment of a signal level monitor and coefficient updating circuit.

Embodiments of a signal level monitor and coefficient updating circuit are described below, in which the digital output of each integrator 448 is provided to and processed through a corresponding register 552 (which may be referred-to as a "coefficient register" or "digital latch register"), and each coefficient ("aN," where "aN" is any of a1, a2, etc.) is updated via its corresponding coefficient register 552.

FIG. 5B schematically illustrates an embodiment of a signal level monitor and coefficient updating circuit 550. The signal level monitor and coefficient updating circuit 550 includes a digital comparator 551. In illustrative embodiments, the digital comparator is operably coupled to node 430 to receive, as digital input to the digital comparator 551, the digital signal output from the analog modulator 420. The digital comparator 551 compares that digital input to a reference quantity 559, and produces as output a comparison signal 553 in a first state (e.g., a digital "1") when the digital input exceeds the reference quantity 559, and outputs the comparison signal 553 in a second state (e.g., a digital "0") when the digital input is less than the reference quantity 559. The comparison signal 553 is provided to the coefficient register 552.

When the digital input exceeds the reference quantity 559, the coefficient register 552 reduces its content (i.e., the digital output its corresponding integrator 448). For example, in some embodiments, the coefficient register 552 reduces the value of its content by right-shifting that content, which in effect halves the coefficient and halves the quantitative value of that content.

When the digital input is less than the reference quantity 559, the coefficient register 552 increases its content (i.e., the digital output of its corresponding integrator 448). For example, in some embodiments, the coefficient register 552 increases the value its content by left-shifting that content, which in effect doubles the coefficient, and doubles the quantitative value of that content.

Illustrative embodiments include hysteresis, by which the signal level monitor and coefficient updating circuit 550 changes the reference quantity 559 in response to the output 553 of the digital comparator 551. In illustrative embodiments, the output 553 of the digital comparator 551 is coupled to a reference level circuit 543 that is configured to change the reference quantity 559 in response to the output 553 of the digital comparator 551. For example, when the output 553 of the digital comparator 551 causes the coefficient register 552 to decrease its content, the reference level circuit 543 causes a corresponding decrease in the reference quantity 559 and supplies that decreased reference quantity 552 to the digital comparator 551. Similarly, when the signal level is low and the output 553 of the digital comparator 551 causes the coefficient register 552 to increase its content, the reference level circuit 543 causes a corresponding increase in the reference quantity 559 and supplies that increased reference quantity 559 to the digital comparator 551.

FIG. 5C schematically illustrates another embodiment of a signal level monitor and coefficient updating circuit 560. The signal level monitor and coefficient updating circuit 560 includes an analog comparator 566. In illustrative embodiments, the input of the analog comparator is coupled to the analog node 405 or the analog node 407 to receive, as analog input, the analog output of the MEMS transducer 112 or amplifier 406, respectively.

The analog comparator 566 compares that analog input to a reference quantity 569 (e.g., an analog voltage having an amplitude), and produces as output a comparison signal 553 in a first state (e.g., a digital "1") when the analog input exceeds the reference quantity 569, and outputs the comparison signal 553 in a second state (e.g., a digital "0") when the analog input is less than the reference quantity 569. The comparison signal 553 is provided to the coefficient register 552 which operates as described above in connection with FIG. 5B.

Illustrative embodiments include hysteresis, by which the signal level monitor and coefficient updating circuit 560 changes the reference quantity 569 in response to the output 553 of the analog comparator 566. In illustrative embodiments, the reference level circuit 543 outputs a digital signal to a digital-to-analog converter ("DAC") 567, which converts that digital signal to a reference voltage 569, and supplies that reference voltage 569 to the analog comparator 566. In operation, when the output 553 of the analog comparator 566 causes the coefficient register 552 to decrease its content, the reference level circuit 543 causes a corresponding decrease in the reference voltage 569 by reducing the digital output of the reference level circuit 543, and when the output 553 of the analog comparator 566 causes the coefficient register 552 to increase its content, the reference level circuit 543 causes a corresponding increase in the reference voltage 569 by increasing the digital output of the reference level circuit 543.

To produce the one-bit signal, the output of the summing node 450 may couple with a 1-bit comparator 452. One skilled in the art may select the value to compare against the output value of the summing node 450, thus producing the noted one-bit signal.

It should be noted that various embodiments are discussed with regard to specific types of devices, such as sigma-delta modulators or integrators 448. Those skilled in the art may implement various embodiments using other devices and thus, discussion of specific modalities is for illustrative purposes and not necessarily intended to limit all embodiments.

Accordingly, illustrative embodiments preferably remain relatively stable across a wider range, producing an improved performance over state of the art microphone modulation schemes.

A listing of certain reference numbers is presented below.
100: MEMS microphone
112: MEMS chip;
114: Piezoelectric structure;
116: ASIC chip;
118: Bond wire;
120: Package;
122: PCB substrate;
124: Acoustic port;
126: Solder pad;
128: Lid;
210: MEMS substrate;
230: Cantilevered piezoelectric segment;
231: Gap between piezoelectric segments;
234: Piezoelectric layer;
236: Mechanical electrode;
238: Sensing electrode;
240: Mechanical electrode;
248: Bond pad;
400: Modulator apparatus;
404: Node;
405: Analog node (transducer output);
406: Amplifier;
407: Analog node (amplifier output);
410: Modulator;
420: Analog modulator;
421: Analog modulator input terminal;
422: First analog modulator summing junction;
423: First analog modulator analog integrator;
424: Second analog modulator summing junction;
425: Second analog modulator analog integrator;
426: Multibit analog-to-digital converter;
427: Digital-to-analog converter;
428: Analog modulator output terminal;
429: Analog modulator feedback path;
440: Digital modulator;
441: Indirect transmission path;
444: Digital signal operator;
446: Analog comparator;
448: Integrator;
543: Reference level circuit;
450: Summing circuit;
451: Digital comparator;
452: One-bit converter;
550: Digital monitor and coefficient update circuit;
551: Digital comparator;
552: Integrator output register or latch;
553: Comparator output;
559: Digital reference value;
560: Digital monitor and coefficient update circuit;
566: Analog comparator;
567: Digital-to-analog converter;
569: Analog comparator reference.

The embodiments of the invention described above are intended to be merely exemplary; numerous variations and modifications will be apparent to those skilled in the art. Such variations and modifications are intended to be within the scope of various embodiments.

What is claimed is:

1. A transducer system comprising:
a micro-electromechanical system (MEMS) transducer configured to produce an analog output signal in response to an incident acoustic signal;
a modulator apparatus comprising:
an analog modulator configured to receive the analog output signal and to produce a first digital signal as a function of the analog output signal, and
a digital modulator configured to receive the first digital signal and to produce a second digital signal as a function of the first digital signal, the analog modulator having an analog order, the digital modulator having a digital order, and the digital order being higher than the analog order;
an amplitude monitor circuit coupled to the modulator apparatus and configured to compare an amplitude of a transducer output with a threshold; and
a digital latch register operably coupled to an integrator block of a plurality of integrator blocks to receive digital output from the integrator block, wherein the amplitude monitor circuit is operatively coupled to the digital latch register and configured to reduce a quantity of the digital output from the integrator block in response to a signal from the amplitude monitor circuit indicating the amplitude of the transducer output exceeds the threshold.

2. The transducer system of claim 1 further comprising an amplifier configured to amplify the analog output signal to produce an amplified analog output signal, the analog output signal received by the analog modulator being the amplified analog output signal.

3. The transducer system of claim 1 wherein the analog modulator comprises a sigma-delta converter.

4. The transducer system of claim 1 wherein the digital modulator comprises a sigma-delta converter.

5. The transducer system of claim 1 wherein the analog order is between second-order and fourth-order.

6. The transducer system of claim 1 wherein the digital order is between fourth-order and sixth-order.

7. The transducer system of claim 1 wherein the second digital signal is a one-bit signal.

8. The transducer system of claim 1 further comprising one or more of a filter and an equalizer downstream of the analog modulator.

9. The transducer system of claim 1 wherein the digital modulator comprises the plurality of integrator blocks, each integrator block having an associated coefficient from a plurality of coefficients, one or more coefficients of the plurality of coefficients being more aggressive when an input signal to a corresponding integrator block rises.

10. The transducer system of claim 1 wherein the MEMS transducer comprises a piezoelectric diaphragm or piezoelectric cantilever.

11. The transducer system of claim 1 wherein the MEMS transducer comprises a capacitive diaphragm to form a condenser.

12. The transducer system of claim 1 further comprising a package having a chamber containing the MEMS transducer and the modulator apparatus, the package having an aperture to receive the incident acoustic signal into the chamber.

13. The transducer system of claim 1, wherein the digital latch register is further configured to increase the quantity of the digital output from the integrator block in response to a signal from the amplitude monitor circuit indicating the amplitude of the transducer output is below the threshold.

14. The transducer system of claim 13, wherein the amplitude monitor circuit and the digital latch register are further configured to implement hysteresis by decreasing the threshold in response to a signal from the amplitude monitor circuit indicating the amplitude of the transducer output exceeds that threshold, and to increase the threshold in response to a signal from the amplitude monitor circuit indicating the amplitude of the transducer output is below the threshold.

15. The transducer system of claim 1, wherein the amplitude monitor circuit comprises a digital comparator operably coupled to receive a digital signal from the analog modulator.

16. The transducer system of claim 1, wherein the amplitude monitor circuit comprises an analog comparator operably coupled to receive an analog signal from the MEMS transducer.

17. The transducer system of claim 16, wherein the amplitude monitor circuit further comprises a digital-to-analog converter operably coupled to the analog comparator, to provide to the analog comparator an analog reference signal having an amplitude, wherein the amplitude of the analog reference signal is a function of an output of the analog comparator.

18. The transducer system of claim 1 wherein:
the transducer system further comprises an amplifier configured to amplify the analog output signal to produce an amplified analog output signal; and
the amplitude monitor circuit comprises an analog comparator having an input in electrical communication with amplifier to receive the amplified analog output signal.

19. The transducer system of claim 1, wherein the amplitude monitor circuit comprises a digital comparator, and wherein the amplitude monitor circuit coupled to the modulator apparatus is configured to compare the amplitude of the transducer output with the threshold using the digital comparator to compare a signal level of the first digital signal with a reference quantity.

20. The transducer system of claim 1, wherein the amplitude monitor circuit comprises an analog comparator, and wherein the amplitude monitor circuit coupled to the modulator apparatus is configured to compare the amplitude of the transducer output with the threshold using the analog comparator to compare the analog output signal with a reference quantity.

21. A method comprising:
receiving an incident acoustic signal at a micro-electrical mechanical system (MEMS) transducer;
producing an analog output signal from the MEMS transducer; and
using a modulator apparatus, an amplitude monitor circuit, and a digital latch register to process the analog output signal;
wherein the modulator apparatus comprising:
an analog modulator configured to receive the analog output signal and to produce a first digital signal as a function of the analog output signal, and
a digital modulator configured to receive the first digital signal and to produce a second digital signal as a function of the first digital signal, the analog modulator having an analog order, the digital modulator having a digital order, and the digital order being higher than the analog order;
wherein the amplitude monitor circuit is coupled to the modulator apparatus and configured to compare an amplitude of a transducer output and to a threshold; and
wherein the digital latch register is operably coupled to an integrator block of a plurality of integrator blocks to receive digital output from the integrator block, wherein the amplitude monitor circuit is operatively coupled to the digital latch register and configured to reduce a quantity of the digital output from the integrator block in response to a signal from the amplitude monitor circuit indicating the amplitude of the transducer output exceeds the threshold.

22. The method of claim 21, further comprising:
increasing, by the digital latch register, the quantity of the digital output from the integrator block in response to a signal from the amplitude monitor circuit indicating the amplitude of the transducer output is below the threshold.

* * * * *